United States Patent
Chia et al.

(10) Patent No.: US 10,026,476 B2
(45) Date of Patent: Jul. 17, 2018

(54) BI-POLAR MEMRISTOR

(71) Applicant: HEWLETT-PACKARD DEVELOPMENT COMPANY, L.P., Houston, TX (US)

(72) Inventors: Leong Yap Chia, Singapore (SG); Ning Ge, Palo Alto, CA (US); Wai Mun Wong, Singapore (SG)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/521,590

(22) PCT Filed: Nov. 25, 2014

(86) PCT No.: PCT/US2014/067358
§ 371 (c)(1),
(2) Date: Apr. 24, 2017

(87) PCT Pub. No.: WO2016/085470
PCT Pub. Date: Jun. 2, 2016

(65) Prior Publication Data
US 2017/0243645 A1    Aug. 24, 2017

(51) Int. Cl.
*G11C 13/00* (2006.01)
*B41J 2/045* (2006.01)

(52) U.S. Cl.
CPC ....... *G11C 13/0038* (2013.01); *B41J 2/04541* (2013.01); *B41J 2/04586* (2013.01); *G11C 13/004* (2013.01); *G11C 13/0069* (2013.01); *G11C 13/0097* (2013.01)

(58) Field of Classification Search
CPC .................. G11C 11/1675; G11C 13/0069
USPC ................................... 365/148, 158
See application file for complete search history.

(56) References Cited

U.S. PATENT DOCUMENTS

| 5,818,473 | A | 10/1998 | Fujii et al. |
| 6,031,753 | A | 2/2000 | Kang et al. |
| 8,416,604 | B2 | 4/2013 | Kim et al. |
| 8,456,900 | B2* | 6/2013 | Lee ............ G11C 13/0007 365/148 |
| 8,681,579 | B2 | 3/2014 | Carter et al. |
| 8,749,422 | B1* | 6/2014 | Moore ............ G11C 27/02 341/120 |
| 9,701,115 | B2* | 7/2017 | Yang ............ B41J 2/14072 |
| 2004/0125643 | A1 | 7/2004 | Kang et al. |

(Continued)

FOREIGN PATENT DOCUMENTS

CN    103022351 A    4/2013

OTHER PUBLICATIONS

Huang, Y., Unipolar Resistive Switching of ZnO-single-wire Memristors, Aug. 7, 2014, Nanoscale Research Letters 2014, 9:381, 5 pages.

*Primary Examiner* — Michael Tran
(74) *Attorney, Agent, or Firm* — HP Inc. Patent Department

(57) ABSTRACT

A circuit comprising an input, a ground, a first switch, a second switch and a bi-polar memristor, wherein the first switch is a first transistor and a gate of the first transistor is connected to a line to instruct setting of the bi-polar memristor, and the second switch is a second transistor and a gate of the second transistor is connected to a line to instruct re-setting of the bi-polar memristor.

14 Claims, 5 Drawing Sheets

(56) References Cited

U.S. PATENT DOCUMENTS

| | | | |
|---|---|---|---|
| 2011/0121359 A1* | 5/2011 | Yang | H01L 29/861 257/109 |
| 2011/0261607 A1* | 10/2011 | Tang | G11C 13/0007 365/148 |
| 2012/0013306 A1* | 1/2012 | Kadirvel | G01R 31/3606 320/134 |
| 2012/0063192 A1* | 3/2012 | Lee | G11C 13/0007 365/148 |
| 2013/0010521 A1* | 1/2013 | Carter | G11C 13/0002 365/148 |
| 2013/0054886 A1* | 2/2013 | Eshraghian | G11C 13/0007 711/108 |
| 2013/0070534 A1* | 3/2013 | Carter | G11C 7/12 365/189.05 |
| 2013/0106930 A1* | 5/2013 | Lea | B41J 2/1753 347/9 |
| 2013/0235651 A1* | 9/2013 | Perner | G11C 13/0007 365/148 |
| 2013/0301335 A1* | 11/2013 | Ong | G11C 29/06 365/148 |
| 2014/0029328 A1 | 1/2014 | Ribeiro et al. | |
| 2014/0153314 A1* | 6/2014 | Baker | G11C 13/0002 365/148 |
| 2014/0158973 A1* | 6/2014 | Yang | H01L 27/101 257/4 |
| 2014/0198559 A1* | 7/2014 | Perner | G11C 13/0007 365/148 |
| 2014/0211536 A1* | 7/2014 | Ordentlich | G11C 13/0007 365/148 |
| 2014/0211544 A1* | 7/2014 | Tavallaei | G11C 5/04 365/148 |
| 2014/0214738 A1* | 7/2014 | Pickett | G11C 11/54 706/27 |
| 2014/0215121 A1* | 7/2014 | Ordentlich | G06F 12/0246 711/102 |
| 2014/0241075 A1* | 8/2014 | Jeon | G11C 13/0004 365/189.09 |
| 2014/0268994 A1* | 9/2014 | Rose | G11C 13/0059 365/148 |
| 2014/0311790 A1* | 10/2014 | Yang | H01L 45/08 174/260 |
| 2014/0347072 A1* | 11/2014 | Herrmann | G01R 35/005 324/601 |
| 2014/0362650 A1* | 12/2014 | Castro | G11C 13/0004 365/189.011 |
| 2015/0076438 A1* | 3/2015 | Cho | H01L 45/08 257/4 |
| 2015/0117087 A1* | 4/2015 | Golke | G11C 13/0069 365/148 |
| 2016/0110644 A1* | 4/2016 | Huang | G11C 13/0007 706/25 |
| 2016/0189775 A1* | 6/2016 | Buchanan | G11C 13/003 257/4 |
| 2016/0212512 A9* | 7/2016 | Mazed | H04B 10/272 |
| 2016/0267976 A1* | 9/2016 | Cho | G11C 13/0007 |
| 2016/0271947 A1* | 9/2016 | Yang | B41J 2/04541 |

* cited by examiner

BI-POLAR MEMRISTOR

BACKGROUND

The present disclosure discusses a circuit including a memristor. In one example the circuit may be used in a memory array. In one example a memory array including memristors is used as a memory in an electronic device, such as but not limited to, a fluid ejection device.

A memristor is a device that changes resistance depending upon a potential difference that has been applied across the memristor during a switching event. Each memristor has a switching voltage that refers to a voltage used to switch the state of the memristor. When the supplied voltage is greater than the memristor switching voltage, the memristor switches state, e.g.: from ON state to OFF state or from OFF state to ON state. In an ON state the memristor has a relatively lower resistance and in the OFF state the memristor has a relatively higher resistance. As the resistance changes upon a switching event, the memristor may be used as a memory.

Switching a memristor to an ON state, having a low resistance, is known as setting the memristor. A memristor may be set by applying a potential difference above a first threshold to the memristor. Switching a memristor to an OFF state, having a high resistance, is known as resetting the memristor. A memristor may be reset by applying a potential difference below a second threshold.

In the case of a bi-polar memristor, the first threshold and second threshold are potential differences of opposite polarity. Thus, for example, a positive potential difference above a first threshold, may SET the memristor to an ON state; and a negative potential difference below a second threshold may RESET the memristor to an OFF state. Thus, a voltage source capable of delivering both positive and negative polarities of voltage may be used to SET and RESET the memristor.

BRIEF DESCRIPTION OF THE DRAWINGS

Examples will now be described, by way of non-limiting example only, with reference to the accompanying drawings, in which.

DETAILED DESCRIPTION

In the following description the terms "a" and "an" are used to denote the presence of one or more of a particular element.

The present disclosure describes a circuit with a bi-polar memristor, a first switch and a second switch. By switching the switches, current may be directed through the bi-polar memristor in a first direction, or in a second direction opposite to the first direction. In this way, even if a single polarity of voltage supply/source is available, the bi-polar memristor may be set and reset.

Figure 1:
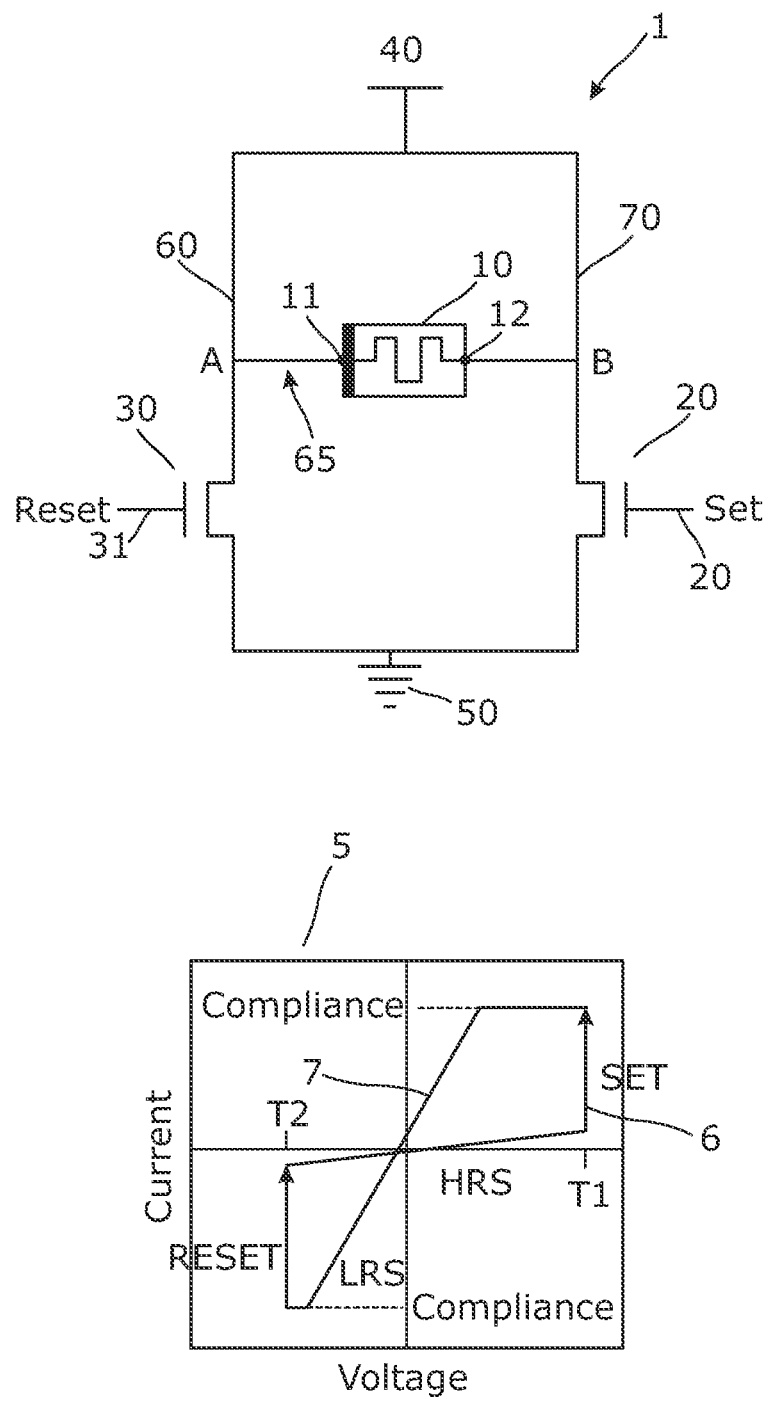
FIG. 1 is an example circuit diagram including a memristor.

FIG. 1 is a circuit diagram showing a circuit 1 which includes a bi-polar memristor 10, a first switch 20 and a second switch 30. These components are connected to an input line 40 and a circuit ground 50. On a first side of the circuit, a first conductive line 60 including the first switch 20 connects the input line 40 to the circuit ground 50. On a second side of the circuit, a second conductive line 70 including the second switch 30, connects the input line 40 to the circuit ground 50. The memristor 10 is on a third conductive line 65 that extends between the first and second conductive lines. A first terminal 11 of the memristor 10 is connected to the first conductive line 60 at point A, while a second terminal 12 of the memristor is connected to the second conductive line 70 at point B. In this context the term "connected" includes both connected directly to and connected indirectly via other components or conductive lines. For example, while not shown in FIG. 1, there may be one or more switches or other components between the line 60 or 70 and the memristor which may be closed to select the memristor.

A voltage may be applied to the input line 40 so that a potential difference arises between the input line 40 and the ground 50. In one example the voltage comes from a voltage source that is able to supply a single polarity of voltage, but not able to supply two different polarities of voltage. For instance the voltage source may be able to supply a positive voltage, but not a negative voltage. In one example the voltage source is an application specific integrated chip (ASIC) that has an output connected to the input line 40 of the circuit. The input line 40 may be used as a read/write line to read or write to the memristor 10.

If a potential difference is applied to the memristor 10, such that the first terminal 11 is at a higher potential than the second terminal 12, then current may flow in a first direction from the terminal 11 to the terminal 12 through the memristor. If the potential difference is above a switching threshold of the memristor, then it may switch the memristor from a high resistance state (OFF) to a low resistance state (ON). This is known as "setting" the memristor. If the second terminal 12 has a higher potential than the first terminal 11, then a current may flow in a second direction from terminal second terminal 12 to first terminal 11. This second direction is opposite to the first direction. If this negative potential difference is greater in magnitude than a second threshold then it may switch the memristor from the low resistance state (ON) to a high resistance state (OFF). This is known as "re-setting" the memristor.

A graph 5 in FIG. 1 shows an example of the variation of current against voltage for one type of bi-polar memristor. Initially the memristor is in an OFF state and has high resistance. This is known as the high resistance state (HRS). The voltage against current in the OFF or HRS state is shown by the solid line 6. The memristor remains in the OFF state until the voltage is increased to a first threshold T1. At T1 the resistance rapidly decreases, as can be seen by the increased current, and the memristor enters an ON state or low resistance state (LRS). This is known as setting the memristor. The voltage against current in the LRS is shown by the dashed line 7. The memristor remains in the LRS until the voltage is reduced to below a second threshold T2 which is a negative voltage. That is the thresholds T1 and T2 have opposite polarity. At T2 the memristor changes back to a HRS as shown by the rapidly decreasing current. This process is known as re-setting the memristor.

The state of the memristor may be determined, i.e. "read", by applying a voltage that is smaller in magnitude than the switching thresholds, and measuring the current; or by applying a current such that the voltage drop across memristor is smaller in magnitude than the switching voltage threshold, and measuring the voltage. From the current and voltage a resistance of the memristor can be inferred and its state known.

The memristor may be written to, e.g. set or unset, by applying a potential difference above the threshold T1 or below the threshold T2. The circuit shown in FIG. 1 is capable of setting and re-setting the memristor when a single polarity of voltage is supplied on the input line 40. The circuit is able to do this by switching between a first configuration and a second configuration.

Figure 2:
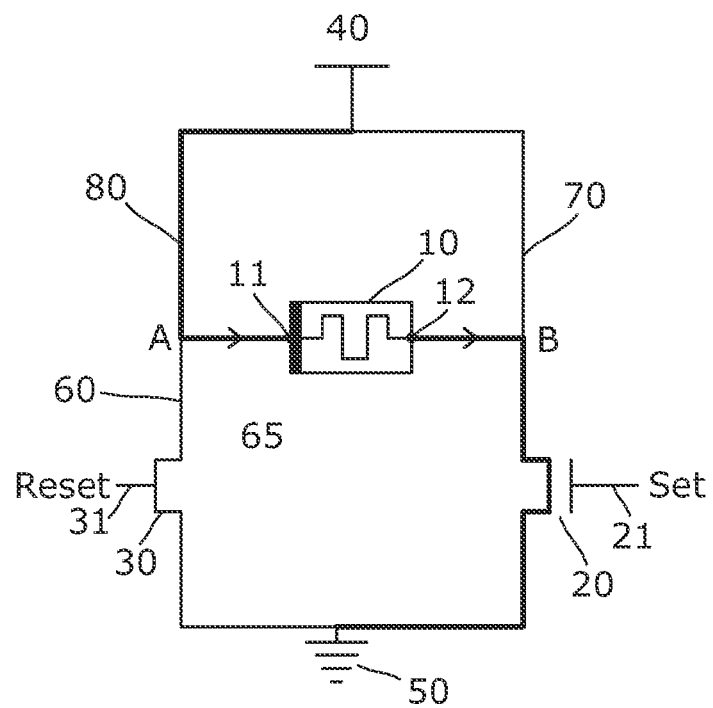
FIG. 2 shows a first conductive path through the circuit of FIG. 1.

In the first configuration, shown in FIG. 2, the first switch 20 is closed (i.e. ON) and the second switch 30 is open (i.e. OFF). The first configuration creates a first conductive path 80, between the input line 40 and the ground 50. The first conductive path 80 is marked in bold in FIG. 2. Current is able to travel along the first conductive path 80 between the input line 40 and the ground 50 and travels in a first direction through the memristor 10. The potential difference between the voltage input 40 and the ground 50 causes a voltage drop across the memristor. If the voltage source is positive then the potential difference, or voltage drop, between the first terminal 11 and second terminal 12 of the memristor is positive. If this potential difference is greater than the first switching threshold then it will SET the memristor.

Figure 3:
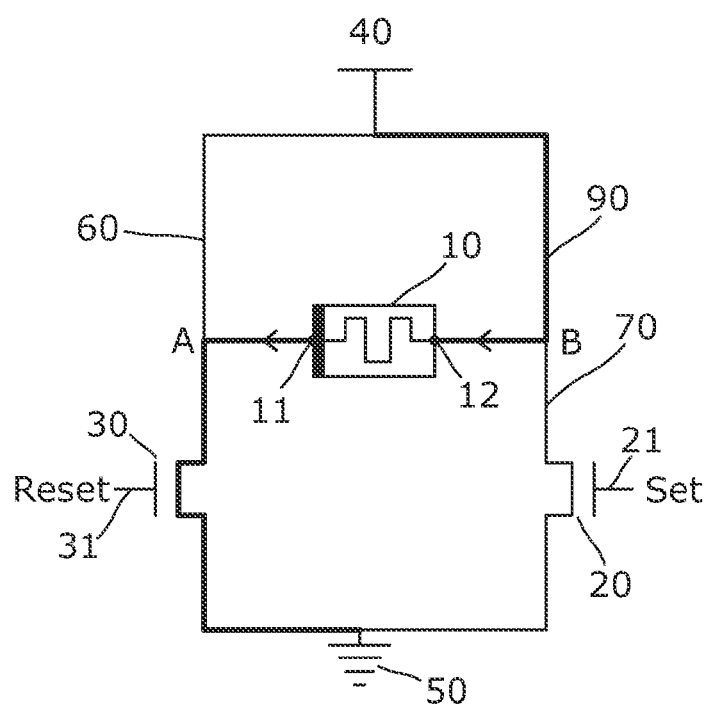
FIG. 3 shows a second conductive path through the circuit of FIG. 1.

In the second configuration, shown in FIG. 3, the first switch 20 is open (i.e. OFF) and the second switch 30 is closed (i.e. ON). As shown in FIG. 3, the first configuration creates a second conductive path 90, between the input line 40 and the ground 50. The second conductive path 90 is marked in bold in FIG. 3. Current is able to travel along the first path between the input line 10 and the ground 40 and travels in a first direction through the memristor 10. The potential difference between the voltage input 40 and the ground 50 causes a voltage drop across the memristor. If the voltage source is positive then the potential difference, or voltage drop, between the first terminal 11 and second terminal 12 of the memristor is negative. If this potential difference is lower (i.e. greater in magnitude) than the second switching threshold then it will RESET the memristor.

Thus it can be seen, that by switching the path between the voltage input 40 and the ground 50, the polarity of the potential difference across the memristor 10 may be reversed. This allows both setting and re-setting of the memristor, even when the voltage input supplies a single polarity of voltage.

The first switch 20 and second switch 30 may be transistors. In one example a gate of the first transistor 20 may be connected to a SET line 21. A gate of a second transistor 30 may be connected to a RESET line 31. The SET line and RESET line may be connected to control circuitry such as an ASIC.

When a signal is sent on the SET line 21 to the gate of the first transistor 20, it turns on the first transistor 20. When a positive voltage is applied to the input line 40 a positive potential difference is set up between the first terminal 11 and second terminal 12 of the memristor 10. Current may flow between the input 40 and the ground 50 along the first path 80 in the direction shown by the arrows. If the signal on the input line 40 is a write signal, i.e. if the input voltage is high enough, and the resulting potential difference across the memristor is above a first switching threshold, then the memristor 10 may be set to the ON state.

When a signal is sent on the RESET line 31 to the gate of the second transistor 30, it turns on the second transistor 30. When a positive voltage is applied to the input line 40, a negative potential difference is set up between the first terminal 11 and second terminal 12 of the memristor 10. Current may flow along the second path 90 in the direction shown by the arrows. If the signal on the input line 40 is a write signal, i.e. if the input voltage is high enough, and the resulting potential difference across the memristor is of a magnitude greater than a second switching threshold, then the memristor may be reset to the OFF state.

The control circuitry, e.g. ASIC, may be such that a signal is sent on either the SET line or the RESET line at any one time, but not both simultaneously. Table 1 shows the logical operation of the circuit based on the signals on the reset and set lines.

TABLE 1

| Reset Line | Set Line | Memristor Operation |
| --- | --- | --- |
| 0 | 0 | No operation |
| 0 | 1 | Set |
| 1 | 0 | Reset |
| 1 | 1 | Not allowed |

Figure 4:
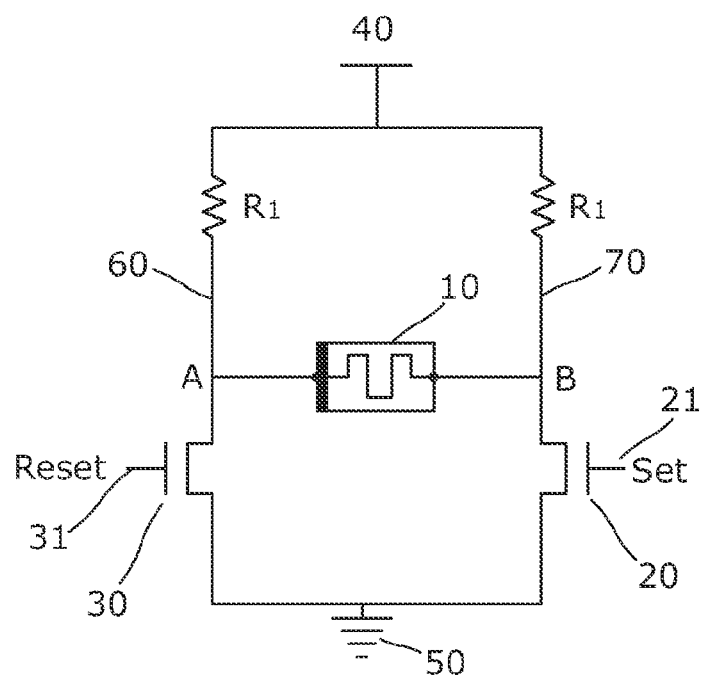
FIG. 4 shows another example circuit including a memristor.

FIG. 4 shows an example, which is similar to FIG. 1, but in which a resistor $R_1$ is on the first line 60 and a resistor $R_2$ is on the second line 70. In this example the resistors are positioned above the first switch 20 and the second switch 30. The resistors may moderate the potential difference across the memristor 10. In one example the first switch 20 and second switch 30 are NMOS transistors and the resistors $R_1$ and $R_2$ help to moderate the drain voltage to an appropriate value for operation of the transistor.

Figure 5:
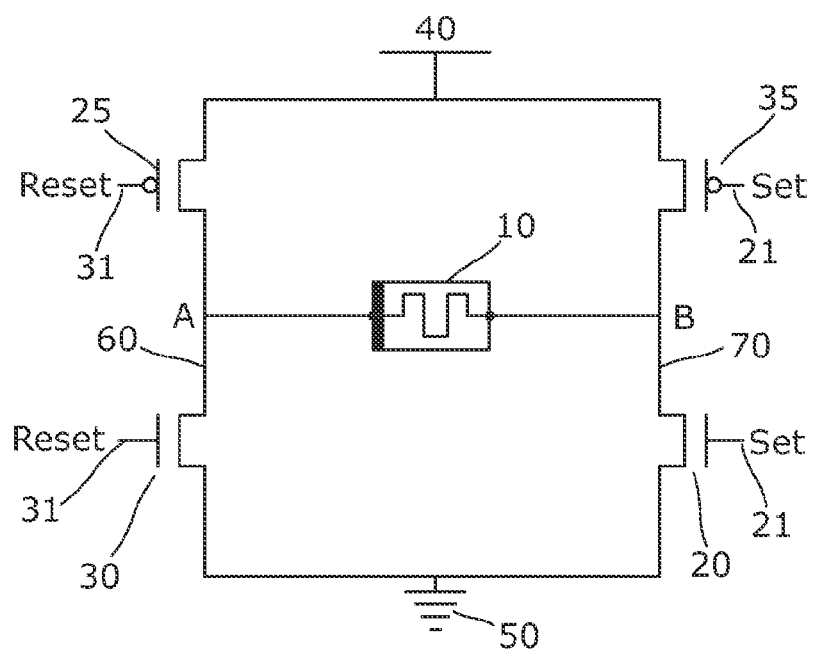
FIG. 5 shows another example circuit including a memristor.

FIG. 5 shows an example, which is similar to FIG. 1, but in which a third switch 25 is positioned on the first conductive line 60 and a fourth switch 35 is positioned on the second conductive line 70. The third switch 25 forms part of the first path from the input line 40 to the ground 50. That is when the first switch 20 and the third switch 25 are closed, current can flow through the third switch 25, past junction A, through the memristor 10 to junction B and through the first switch 20 to the ground. Thus the circuit adopts the first configuration and can SET the memristor, when the first and third switches are closed.

The fourth switch 35 forms part of the second path from the input line 40 to the ground 50. That is when the second switch 30 and the fourth switch 35 are closed, current can flow through the fourth switch 35, past junction B, through the memristor 10 to junction A and through the second switch 30 to the ground. Thus the circuit adopts the second configuration and can RESET the memristor, when the second and fourth switches are closed.

The first to fourth switches 20, 25, 30, 35 may be transistors. The first and third switches may be referred to as SET transistors, as the memristor may be set when these switches are ON. The second and fourth switches may be referred to as RESET transistors, as the memristor may be reset when these switches are ON. Lines carrying signals to gates of the SET transistors may be referred to as lines for carrying a signal to instruct setting of the memristor. Lines carrying signals to gates of the RESET transistors may be referred to as lines for carrying a signal to instruct resetting of the memristor.

In one example the circuit may have a first line nominally referred to as a SET line 21 and a second line nominally referred to as a RESET line 31. A controller, such as an ASIC, may supply signals to the SET and RESET lines such that when the SET line is high, the RESET line is low and vice versa. In this way, the SET and RESET lines may work together, to switch the circuit from the first configuration in which the memristor may be set to the second configuration in which the memristor may be reset.

In one example the transistors are NMOS or PMOS transistors. A PMOS transistor is ON when the gate voltage is low, while a NMOS transistor is ON when the gate voltage is high.

In the example illustrated in FIG. 5, the first switch 20 is an NMOS transistor connected to the SET line 21 and the third switch 25 is a PMOS transistor connected to the RESET line 25. Thus when the SET line 21 is high and the RESET line 25 is low, both the switches will be turned ON connecting the voltage input 40 to the ground 50 along the first path. Thus when a positive voltage is applied at input 40, a positive potential difference is applied across memristor 10. On the other hand, when the SET line 21 is low and the RESET line 31 is high, both of these transistors are off and the first path is broken.

The second switch 30 is a NMOS transistor connected to RESET line 31 and the fourth switch 35 is a PMOS transistor connected to SET line 21. Thus, when the RESET line is high and the SET line is low, the switches 30, 35 are turned ON connecting the voltage input 40 to the ground 50 along the second path. Thus when a positive voltage is applied at the input 40, a negative potential difference is applied across the memristor 10. On the other hand, when the SET line is high and the RESET line is low, both of these transistors are off and the second path is broken.

In other examples both the first and third switches could both be NMOS transistors or both could be PMOS transistors. The circuit connections to the SET and RESET lines may be modified depending upon the transistor types, to ensure that the first and third transistors 20, 25 are ON when the SET line is high and that the second and fourth transistors 30, 35 are ON when the RESET line is high.

Figure 6:
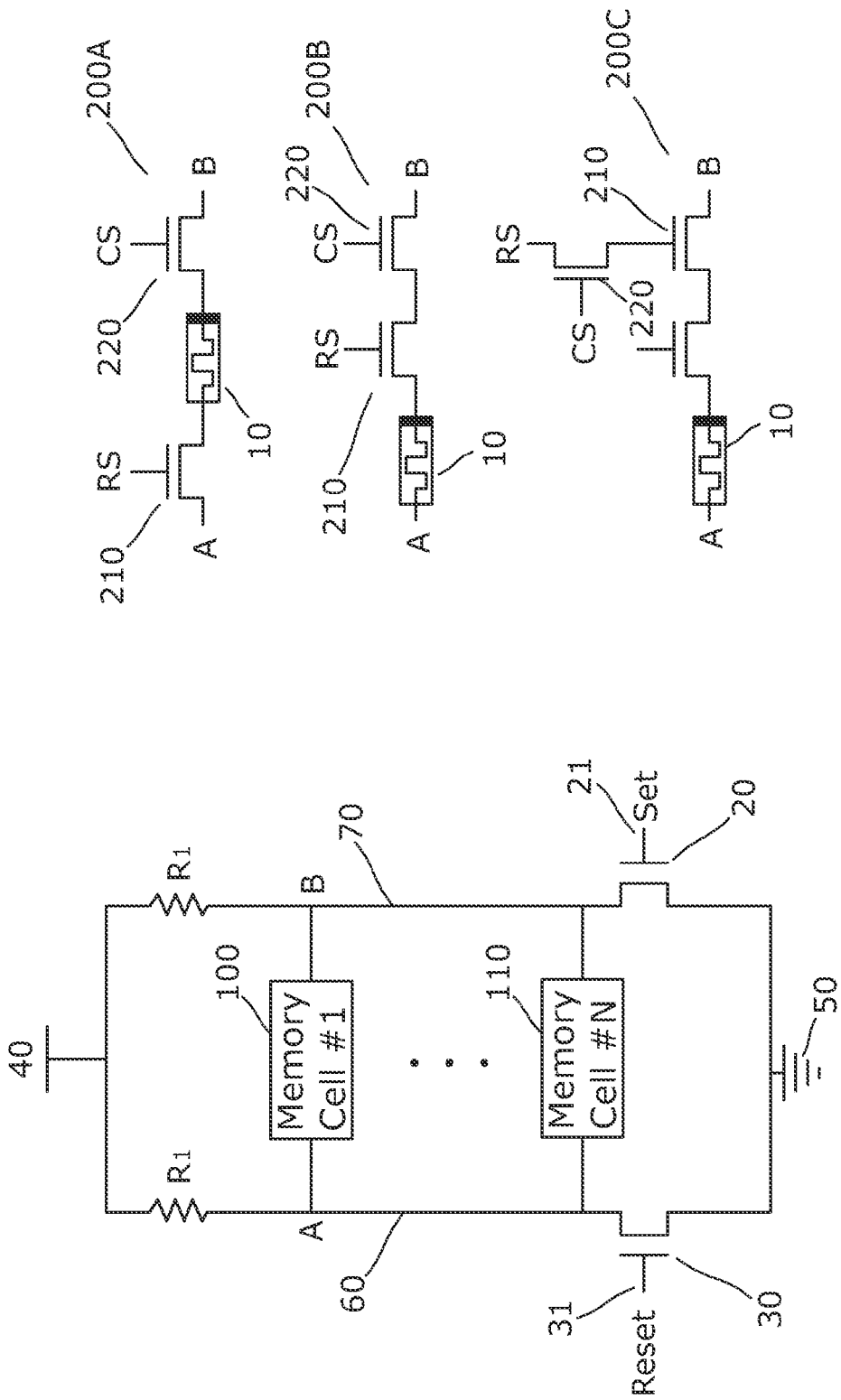
FIG. 6 shows an example memory array.

FIG. 6 shows an example of a memory array. The memory array is similar to the circuit of FIG. 4, but has a plurality of memory cells connected in parallel between the input line 40 and the ground 50. Each memory cell may be on a respective conductive line connecting the first conductive line 60 and the second conductive line 70. The illustrated examples shows the first memory cell 100 and the last or Nth memory cell 110 with the memory cells in-between indicated by dotted lines.

Each memory cell comprises a memristor. In one example the memory array may be such that a single memory cell is selected at any one time. At any one time a single memory cell of the plurality of memory cells may be selected and read or written to. In this way a single input line 40 may be used to power the read or write operation to any of the memory cells.

For example, each memory cell may include a selection switch, or a plurality of selection switches, for selecting the memory cell. For instance, when the selection switch or selection switches in a memory cell are closed the memristor is in contact with lines 70 and 60 of the circuit so that a current at low voltage may be passed through the cell to read the memristor, or a larger potential difference may be applied across the memristor to write to the memristor. The selection switches may be transistors having a gate connected to a selection line that conveys a selection signal to the cell.

In one arrangement the memory cells may addressed by row. For instance each memory cell belongs to a respective row and is connected to a respective row line. A signal on the row line turns on a switch in the memory cell to select that memory cell. In another example, each memory cell is addressed by row and column. For instance there may be a plurality of row lines and a plurality of column lines each to convey a signal selecting the respective row or column. Each memory cell may be connected to a row line and a column line. In that case each memory cell includes the memristor and a row switch and a column switch, both of which must be turned on to select the memristor by connecting the memristor to the circuit. The row switch may be a transistor having a gate connected to a row selection line and the column switch may be a transistor having a gate connected to a column selection line.

200A shows an example memory cell in which the memristor 10 is connected in series between the row switch 210 which has a gate connected to a row line RS and the column switch 220 that has a gate connected to a column line CS. In another example 200B, the memristor 10 is in series with the row switch 210 and column switch 220, but the row switch 210 and column switch 220 are positioned to one side of the memristor. In another example 200C, the memristor 10 is in series with the row switch 210 and the gate of the row switch 210 which is connected to a row line RS. The column switch 220 is on the row line 210 and a gate of the column switch 220 is connected to a column line CS. Thus when the row switch and column switch are turned on the memristor is connected to the rest of the circuit and the cell is effectively selected. These are just examples and other implementations and variations are possible.

In the example of FIG. 6, there are a pair of resistors $R_1$ and $R_2$ on the first and second conductive lines 60, 70. In other examples there could be no resistors, as in FIG. 1. In still another example the first switch and the second switch may be positioned between the input line 40 and the first memory cell 100, instead of between the last memory cell 110 and the ground 50. In still another example, there may be third and fourth switches as illustrated in FIG. 5. In that case the first and second switches may be located between the last memory cell 110 and the ground 50, and the third and fourth switches may be located between the input line 40 and the first memory cell 100.

The circuits and memory arrays described herein may be used to provide a memory on an electronic device. For example, they may be used in a fluid ejection device. One example of a fluid ejection device is a printhead for ejecting ink. However, a fluid ejection device is not limited thereto and may be used for ejecting magnetic substances, pharmaceuticals and other fluids. Furthermore, the memory arrays and circuits may also be used in a system on chip (SOC) or embedded system. In one example the memristor or the memory array may be used for storing data identifying the electronic device, or codes used to validate the electronic device as a genuine device which may be used with other equipment belonging to the same vendor.

Figure 7:
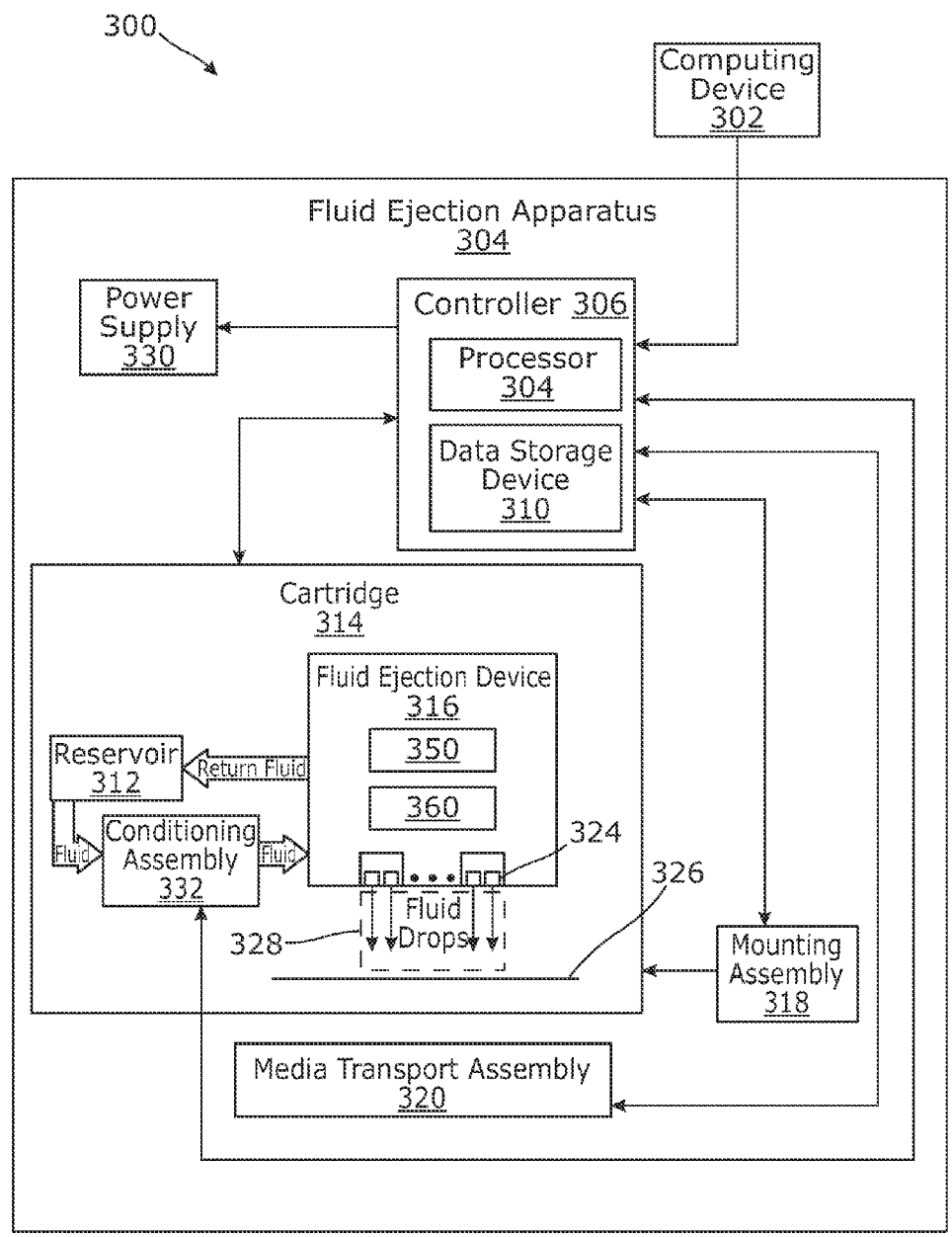
FIG. 7 shows an example fluid ejection device including a memristor.

FIG. 7 shows one example of a system 300 that comprises a fluid ejection device 316 including a memristor circuit, or a memory array, 350 as described above.

The system 300 includes a computing device 302 that is connected to a fluid ejection apparatus 304, such as a printer. The computing device may be connected by a direct wired connection, wireless connection or a computer network. The computing device may send instructions to a controller 306 to instruct printing or ejection of fluid in a precise manner. The controller 306 may be located in the apparatus 304 and may, for example, be an ASIC. The controller 306 may include a processor 308 and a data storage device 310. The controller 306 sends instructions to a fluid ejection device 316 to instruct printing or precision ejection of fluid.

The fluid ejection device 316 may form part of a fluid cartridge 314. For example the fluid cartridge may also include a fluid reservoir 312 and a fluid conditioning assembly 332 through which ink or other fluid is circulated to the fluid ejection device. In other examples the fluid ejection device may be separate and independent from the fluid cartridge, but receive fluid therefrom. A mounting assembly 318 and a media transport assembly 320 may move a media and the fluid ejection device relative to each other so that fluid may be ejected to a desired area of the media. The system may be powered by a power supply 330.

The fluid ejection device 316 includes a memristor circuit or a memory array 350 as described above. This may be used to identify the fluid ejection device to the controller 306. For example, the controller 306 may read and/or write to the memory array 350 to validate that the fluid ejection device is a genuine device that is suitable for use with the fluid ejection apparatus. As the memory array 350 uses memristors it may be relatively small and thus only occupy a relatively small space on the fluid ejection device, leaving other space free for other purposes. In one example the controller 306 is capable of delivering a single polarity of voltage in the signals it sends to the fluid ejection device, for instance positive voltages. With the memory array described above, memristor memory cells may still be set and reset even when a single polarity of voltage is delivered to the fluid ejection device.

The fluid ejection device also includes circuitry 360 to eject drops of fluid from apertures in the fluid ejection device. The circuitry may be receive instruction signals from the controller 306 and process these signals to eject fluid from particular fluid ejection apertures, for instance by heating of thermal ejection elements or otherwise. The memory array 350 and circuitry 360 may share some common circuit elements, for instance voltage input and/or some signal lines. This may save cost and minimize the space used on the silicon real estate of the fluid ejection device.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A circuit comprising:
a voltage input;
a bi-polar memristor;
a first conductive path connecting the bi-polar memristor to the voltage input and a circuit ground, the first conductive path including a first transistor comprising a gate connected to a line to instruct setting of the bi-polar memristor;
a second conductive path connecting the bi-polar memristor to the voltage input and the circuit ground, the second conductive path including a second transistor comprising a gate connected to a line to instruct re-setting of a bi-polar memristor;
in a first configuration of the circuit, the first transistor is closed and the second transistor is open, such that when a first polarity of voltage is supplied to the voltage input, current can flow along the first conductive path and through the bi-polar memristor in a first direction; and
in a second configuration of the circuit, the first transistor is open and the second transistor is closed, such that when the first polarity of voltage is supplied to the voltage input, current can flow along the second conductive path and through the bi-polar memristor in a second direction that is opposite to the first direction.

2. The circuit of claim 1, wherein the first conductive path includes a first resistor, and the second conductive path includes a second resistor.

3. The circuit of claim 1, wherein:
the first conductive path includes a first switch that is closed in the first configuration of the circuit and open in the second configuration of the circuit; and
the second conductive path includes a second switch that is open in the first configuration of the circuit and closed in the second configuration of the circuit.

4. A circuit comprising:
a voltage input
a plurality of bi-polar memristors in parallel between the voltage input and a circuit ground, the plurality of bi-polar memristors comprising a first bi-polar memristor;
a first conductive path connecting the first bi-polar memristor to the voltage input and the circuit ground, the first conductive path including a first switch;
a second conductive path connecting the first bi-polar memristor to the voltage input and the circuit ground, the second conductive path including a second switch;
in a first configuration of the circuit, the first switch is closed and the second switch is open, such that when a first polarity of voltage is supplied to the voltage input, current can flow along the first conductive path and through the first bi-polar memristor in a first direction; and
in a second configuration of the circuit, the first switch is open and the second switch is closed, such that when the first polarity of voltage is supplied to the voltage input, current can flow along the second conductive path and through the first bi-polar memristor in a second direction that is opposite to the first direction.

5. The circuit of claim 4, wherein each respective bi-polar memristor of the plurality of bi-polar memristors is part of a memory cell that includes a column switch and a row switch to select the respective bi-polar memristor in the memory cell.

6. The circuit of claim 1, further comprising a voltage source that is to supply a single polarity of voltage to the voltage input.

7. A memory array comprising:
a plurality of memory cells;
a signal input line to supply a read or write signal to a memory cell of the plurality of memory cells;
a first conductive line and a second conductive line connected in parallel between the signal input line and a ground, the plurality of memory cells connected in parallel between the first conductive line and the second conductive line, each memory cell of the plurality of memory cells including a bi-polar memristor, wherein each respective memory cell of the plurality of memory cells comprises a selection switch to select the bi-polar memristor in the respective memory cell;

a SET transistor on the first conductive line or on the second conductive line, the SET transistor having a gate connected to a line to instruct setting of the bi-polar memristor; and a RESET transistor on the first conductive line or on the second conductive line, the RESET transistor having a gate connected to a line to instruct re-setting of the bi-polar memristor.

8. The memory array of claim 7, wherein:
the plurality of memory cells includes a first memory cell that is the closest memory cell to the signal input line and a last memory cell that is the closet memory cell to the ground;
the SET transistor is between the signal input line and the first memory cell, or between the last memory cell and the ground; and
the RESET transistor is between the signal input line and the first memory cell, or between the last memory cell and the ground.

9. The memory cell of claim 7, wherein the plurality of memory cells are arranged in a grid including a plurality of rows and columns, and each respective memory cell of the plurality of memory cells includes a row switch and a column switch, the respective memory cell being selected when both the row switch and the column switch are on.

10. The memory array of claim 7, further comprising an application specific integrated chip (ASIC) connected to the signal input line, wherein the ASIC is capable of providing a single polarity of voltage and is not capable of providing two different polarities of voltage.

11. A fluid ejection device comprising:
a plurality of nozzles through which fluid is to be ejected;
circuitry for receiving signals and driving fluid through selected nozzles in response to the received signals;
an input line;
a bi-polar memristor connected to the input line;
a first switch on a first side of the bi-polar memristor and a second switch on a second side the bi-polar memristor;
the circuitry changeable between a first configuration and a second configuration by switching of the first and second switches;
in the first configuration of the circuitry, the first switch is ON and the second switch is OFF forming a first conductive path between the input line and a ground such that when a voltage having a first polarity is applied to the input line a first polarity of potential difference is applied across the bi-polar memristor; and
in the second configuration of the circuitry, the first switch is OFF and the second switch is ON forming a second conductive path between the input line and the ground such that when a voltage having the first polarity is applied to the input line, a second polarity of potential difference is applied across the bi-polar resistor, the second polarity being opposite to the first polarity.

12. The fluid ejection device of claim 11, wherein:
the first switch is a first transistor and a gate of the first transistor is connected to a line to carry a signal to instruct setting of the bi-polar memristor; and
the second switch is a second transistor and a gate of the second transistor is connected to a line to carry a signal to instruct re-setting of the bi-polar memristor.

13. The fluid ejection device of claim 11, wherein:
the bi-polar memristor has a first terminal and a second terminal;
the first configuration of the circuitry forms a conductive path connecting the first terminal of the bi-polar memristor to the input line and the second terminal of the bi-polar memristor to the ground;
the second configuration of the circuitry forms a conductive path connecting the second terminal of the bi-polar memristor to the input line and the first terminal of the bi-polar memristor to the ground.

14. A fluid ejection device comprising:
a plurality of nozzles through which fluid is to be ejected;
the circuit of claim 1 to receive a signal and drive fluid through a selected nozzle of the plurality of nozzles in response to the received signal.

* * * * *

UNITED STATES PATENT AND TRADEMARK OFFICE
CERTIFICATE OF CORRECTION

PATENT NO. : 10,026,476 B2
APPLICATION NO. : 15/521590
DATED : July 17, 2018
INVENTOR(S) : Leong Yap Chia et al.

It is certified that error appears in the above-identified patent and that said Letters Patent is hereby corrected as shown below:

In the Claims

In Column 8, Line 30, Claim 4, after "input" insert -- ; --.

In Column 9, Line 19, Claim 8, delete "closet" and insert -- closest --, therefor.

Signed and Sealed this
Twenty-fifth Day of December, 2018

Andrei Iancu
*Director of the United States Patent and Trademark Office*